United States Patent [19]

Malec et al.

[11] Patent Number: 5,111,158

[45] Date of Patent: May 5, 1992

[54] MODULATED VOLTAGE SUPPLY AND FAULT MONITORING THEREOF ADAPTED FOR USE IN AN RF POWER AMPLIFIER SYSTEM

[75] Inventors: Jeffrey M. Malec; Hilmer I. Swanson, both of Quincy, Ill.

[73] Assignee: Harris Corporation, Melbourne, Fla.

[21] Appl. No.: 722,298

[22] Filed: Jun. 27, 1991

[51] Int. Cl.$^5$ .............................. H03F 1/26; H03F 3/24
[52] U.S. Cl. ........................................ 330/297; 330/10; 330/298; 330/207 P; 330/200; 455/108
[58] Field of Search .................. 330/297, 10, 207 A, 330/200, 298, 207 P, 295, 124 R; 455/108, 116, 117, 126, 127; 361/91; 363/50, 51, 52-58

[56] References Cited

U.S. PATENT DOCUMENTS

| | | | |
|---|---|---|---|
| 4,199,723 | 4/1980 | Cummings et al. | 455/108 |
| 4,218,660 | 8/1980 | Carver | 330/297 |
| 4,240,036 | 12/1980 | Kohler | 330/10 |
| 4,442,407 | 4/1984 | Apel | 330/297 |
| 4,510,456 | 4/1985 | Swanson | 330/10 |

Primary Examiner—Eugene R. LaRoche
Assistant Examiner—Tan Dinh
Attorney, Agent, or Firm—Tarolli, Sundheim & Covell

[57] ABSTRACT

An RF power amplifier system is disclosed having a modulated voltage supply and fault monitoring thereof. The modulated DC voltage supply receives an input voltage as well as a modulating signal, such as an audio signal, to provide a modulated voltage which has been amplitude modulated in accordance with the amplitude variations of the modulating signal. Circuitry is provided for providing a variable reference signal which has a magnitude that varies with that of the modulating signal. A fault comparator compares the modulated signal with the variable reference signal and provides a fault signal dependent upon the comparison.

13 Claims, 6 Drawing Sheets

5,111,158

MODULATED VOLTAGE SUPPLY AND FAULT MONITORING THEREOF ADAPTED FOR USE IN AN RF POWER AMPLIFIER SYSTEM

BACKGROUND AND FIELD OF THE INVENTION

The present invention relates to a modulated voltage supply and fault monitoring thereof and more particularly to improvements therein which are adaptable for use with an RF power amplifier system.

An RF power amplifier system is disclosed in the U.S. Pat. No. to H. I. Swanson 4,580,111. This patent discloses an amplitude modulator which generates an amplitude modulated carrier signal by selectively turning on and off a plurality of RF amplifiers in a digital manner to produce amplitude modulation. Each of the RF amplifiers includes a plurality of switching transistors, each of which takes the form of a MOSFET transistor, connected together in a bridge circuit. The output terminals of each bridge circuit are connected across a primary winding of a transformer having a secondary winding. The secondary windings of all of the power amplifiers are connected together in series for combining the amplified RF signals. The combined RF signal is supplied to a load, such as an antenna. The output of the power amplifiers can change with the level of RF output current. The same RF current flows in all of the power amplifiers. When the first power amplifier turns on, there is very little current flowing. When the second power amplifier turns on, the RF current doubles. As more and more amplifiers are turned on, the RF current increases to a relatively high level. When the RF current increases to a sufficiently high RF level, the ON impedance of the switching transistors increases in magnitude.

As more power amplifiers turn on, the more difficult it becomes to turn on additional power amplifiers. It is for this reason that the power amplifier turn on signal has been obtained from a voltage supply that is modulated by the sum of the audio frequency signal and a DC power level signal so that the turn on signal will vary in magnitude with that of the number of power amplifiers that are turned on. This is required in order to drive the MOSFET switching transistors into saturation so as to act as switches instead of resistors. If they are not driven into saturation and act as resistors, excessive MOSFET dissipation, high stress and potential failure may result.

Modulated voltage supplies which provide a potential which varies with a modulating signal, such as an audio signal, are known in the prior art. Examples of such prior art are found in the U.S. Pat. Nos. to T. R. Apel 4,442,407 and W. B. Bruene et al. U.S. Pat. No. 3,413,570.

While it is known to employ a modulated voltage supply for providing a modulated voltage which serves as a turn on signal which varies in magnitude in accordance with a modulating signal, it is also known to monitor the magnitude of the modulated voltage t determine whether it deviates from a reference level, representative of a faulted condition of the voltage supply. It has been known in the past to employ a fixed DC threshold for a fault comparator wherein the DC threshold has been set at a very low level to allow the negative peak modulation or a low power output to not trip the fault comparator. This fixed threshold has been found to be below the average operating range for such a power supply when employed with an RF transmitter operating at higher power outputs.

SUMMARY OF THE INVENTION

In accordance with one aspect of the present invention, there is provided a modulated voltage supply and fault monitoring circuit. The circuit includes a modulated voltage supply that receives an input voltage as well as a modulating signal for providing a modulated output voltage which has been amplitude modulated in accordance with the amplitude variations of the modulating signal. A reference circuit provides a variable reference signal having a magnitude that varies with that of the modulating signal. A fault comparator compares the magnitude of the modulated signal with that of the variable reference signal and provides a fault signal dependent upon the comparison.

In accordance with a more limited aspect of the present invention, the circuitry is combined with an RF power amplifier system employing a plurality of RF power amplifiers.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF THE PREFERRED EMBODIMENT

One application of the present invention is in conjunction with protecting RF power amplifiers employed in an AM broadcast transmitter. An example of such a transmitter is presented in FIG. 1 and takes the form of a digital amplitude modulator such as that illustrated and described in the aforesaid U.S. Pat. No. 4,580,111, which is assigned to the same assignee as the present invention, the disclosure of which is herein incorporated by reference.

Figure 1:
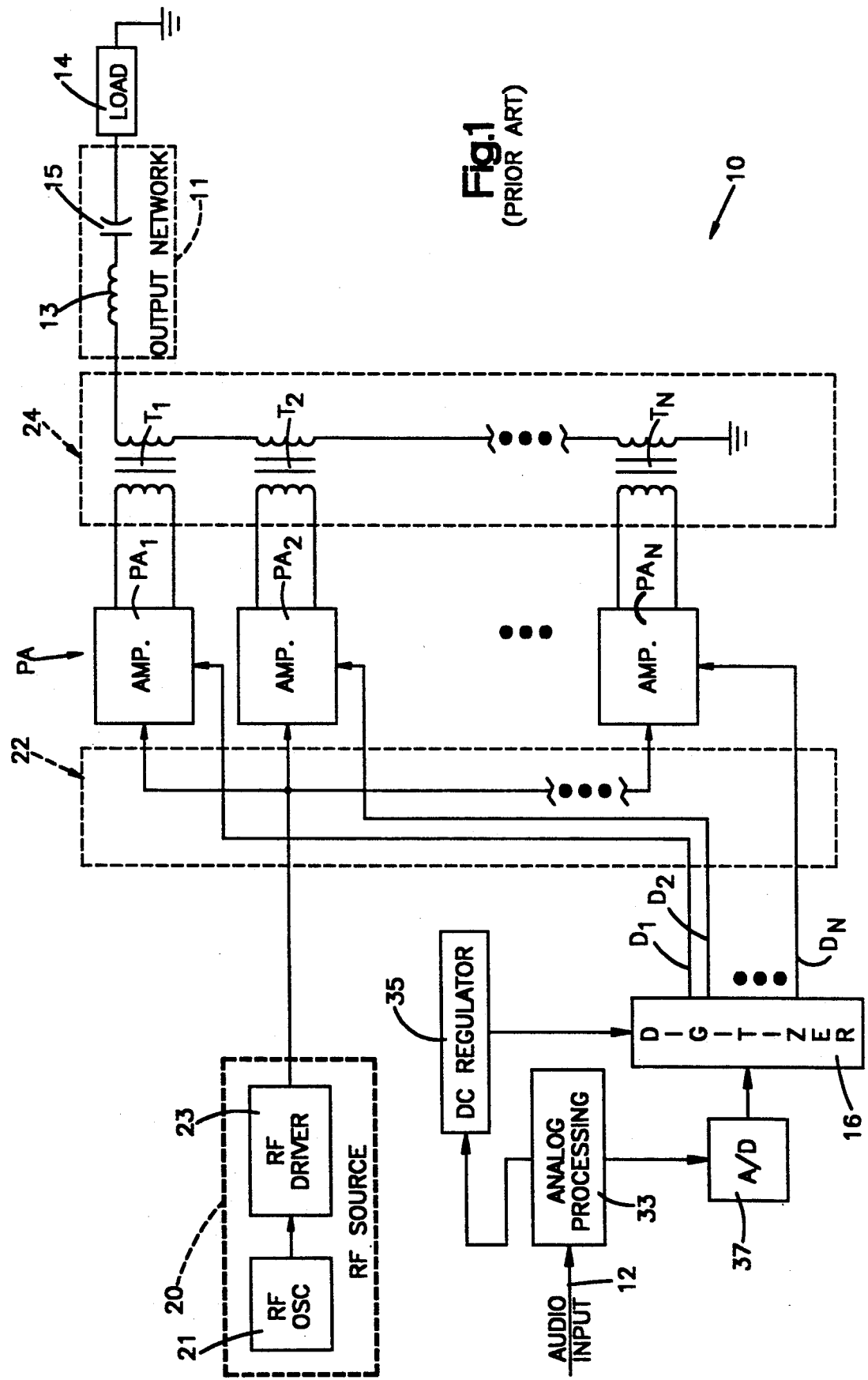
FIG. 1 is a prior art schematic-block diagram illustration of one application to which the present invention may be applied.
Figure 2A:
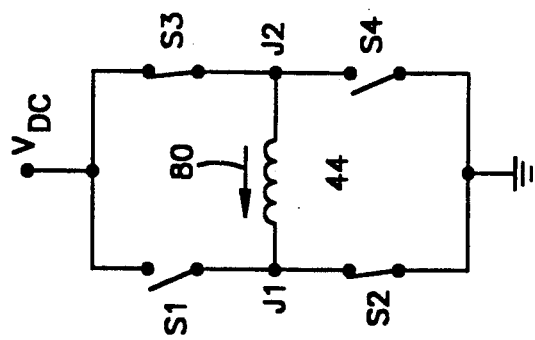
FIG. 2A is a prior art simplified schematic circuit useful in understanding the operation of the circuit shown in FIG. 2.
Figure 2:
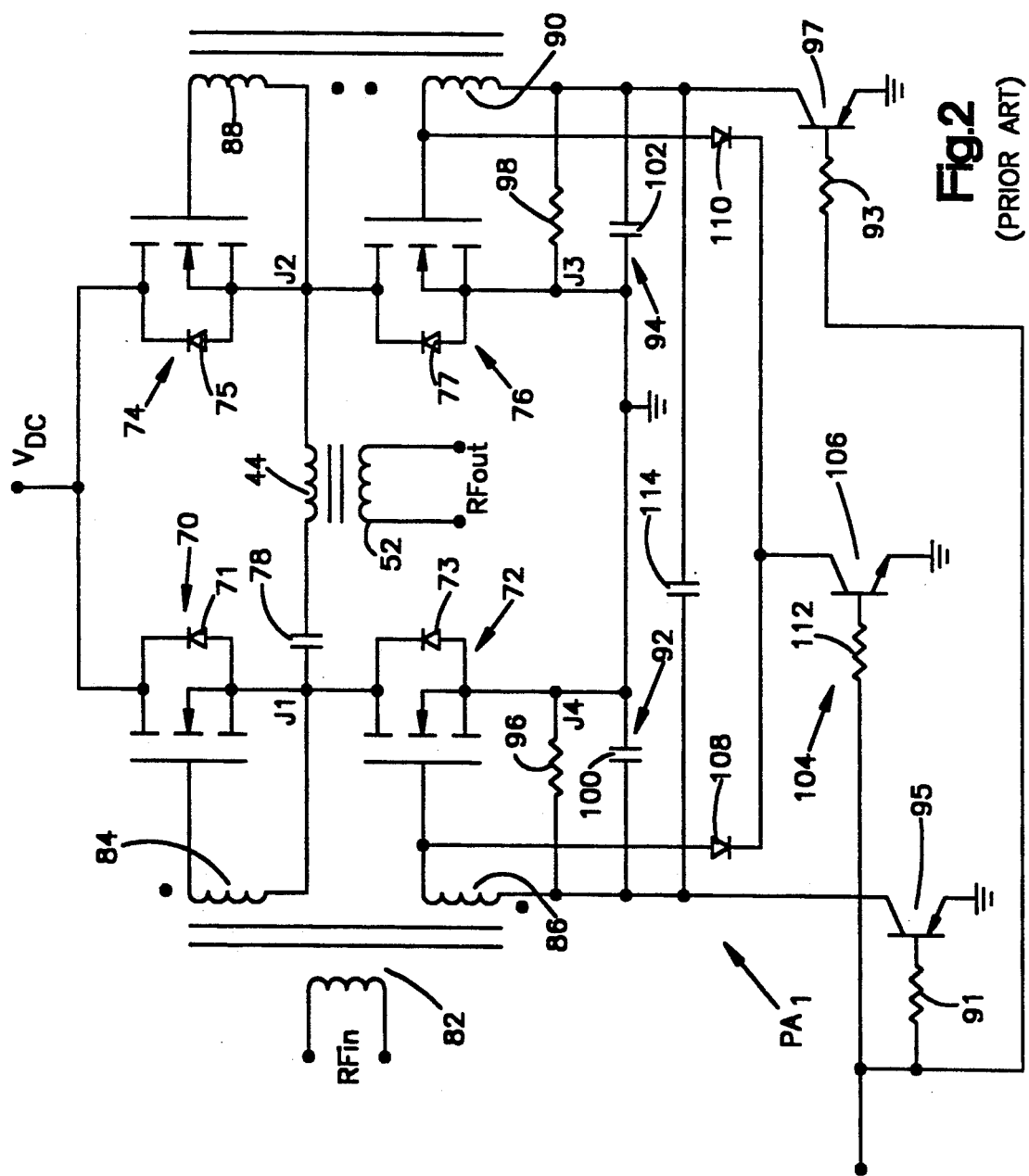
FIG. 2 is a prior art schematic circuit illustration of one of the power amplifiers employed in FIG. 1.
Figure 3:
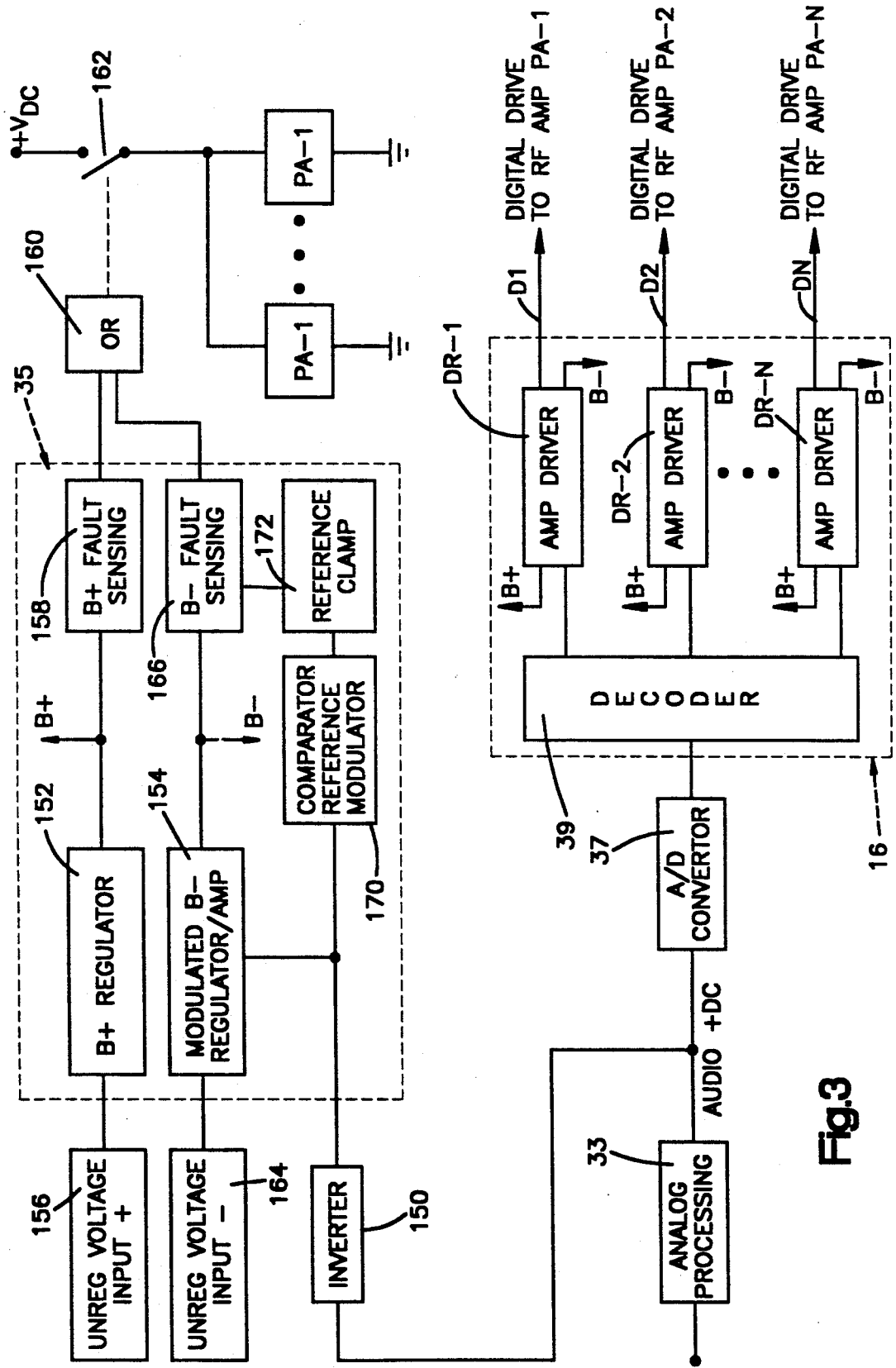
FIG. 3 is a schematic-block diagram illustration incorporating circuitry in accordance with the present invention for use in an application such as that illustrated in FIGS. 1 and 2.

The discussion which follows is directed to an explanation of the operation of the circuitry shown in FIG. 1 followed by a detailed description of a power amplifier as illustrated in FIGS. 2 and 2A herein as background for the discussion of the invention presented with respect to the embodiment illustrated herein in FIG. 3.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is provided on an output line connected to a load 14, which may take the form of an RF transmitting antenna. A digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output control signals D1-DN is supplied to one of a plurality of N RF power amplifiers $PA_1$--$PA_N$. The control signals serve to turn associated power amplifiers either on or off. Thus, if the control signal has a binary 1 level, then its associated amplifier is inactive and no signal is provided at its output. However, if the control signal is of a binary 0 level, then the power amplifier is active and an amplified carrier signal is provided at its output. Each power amplifier has an input connected to a single common RF source 20. The RF source 20 serves as the single source of an RF carrier signal which is supplied by way of an RF splitter 22 so that each amplifier $PA_1$-$PA_N$ receives a signal of like amplitude and phase and frequency. The carrier signal is amplitude modulated in accordance with the control signals D1-DN and the amplitude modulated carrier signals will be of like frequency and phase. These signals are supplied to a combiner circuit 24 comprised of a plurality of transformers $T_1, T_2, \ldots, T_N$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

As is conventional in such a system, the RF source 20 includes an RF oscillator 21 having a frequency on the order of 500 to 1600 KHz. This oscillator feeds an RF driver 23, the output of which is supplied to the power amplifiers $PA_1$-$PA_N$. The RF driver provides power amplification of the RF signal obtained from oscillator 21 prior to the signal being supplied to the power amplifiers at which modulation also takes place. The RF driver 23 may include several stages of amplification and may be configured similar to the power amplifiers $PA_1$-$PA_N$.

FIG. 2 illustrates one form which the power amplifier $PA_1$ of FIG. 1 may take, the other power amplifiers $PA_2$-$PA_N$ being similar. The power amplifier illustrated includes four semiconductor amplifier elements 70, 72, 74 and 76 connected in a bridge arrangement across a DC power supply voltage of, for example, 250 volts. The primary winding 44 of the associated transformer 36 is connected across the bridge junctions $J_1$ and $J_2$ of the four semiconductor elements.

More particularly, the semiconductor amplifier elements are metal oxide semiconductor, field effect transistors (MOSFETs) having three electrodes, conventionally identified as the gate, drain, and source. The drain-source paths of the transistors 70 and 72, representing their primary current paths, are connected in series across the DC power supply, as are the drain-source current paths of transistors 74 and 76. The primary winding 44 of the corresponding combiner transformer T1 is connected in series with a DC blocking capacitor 78 across the common junctions $J_1$ and $J_2$ between transistors 70 and 72 and transistors 74 and 76.

The transistors 70, 72, 74 and 76 effectively operate as switches to connect the two sides of the primary winding 44 to either the DC voltage source or to ground. By proper operation of these transistors, the transformer winding 44 can be connected in either direction across the DC power supply.

This can perhaps be more readily understood by reference to FIG. 2A, which is a simplified illustration of the FIG. 2 circuitry. In FIG. 2A the transistors 70, 72, 74 and 76 are respectively characterized by conventional single pole, single throw switches $S_1$, $S_2$, $S_3$, and $S_4$. As shown in FIG. 2A, the switch $S_1$ is open and the switch $S_2$ is closed, whereby the common junction $J_1$ between them is grounded. The switch $S_3$ is closed and the switch $S_4$ open, however, whereby the junction $J_2$ between those switches is connected to the DC supply voltage. Current will therefore pass through the primary winding 44 in the direction indicated by the arrow 80.

When all four switches $S_1$-$S_4$ are thrown to their opposite states, current will pass through the output winding 44 in the opposite direction. Thus, when switches $S_1$ and $S_4$ are closed and switches $S_2$ and $S_3$ opened, junction $J_1$ is connected to the DC supply and junction $J_2$ is connected to ground. In this case the current through the primary winding 44 of the transformer is in a direction opposite to that indicated by arrow 80 of FIG. 2A. An AC signal can thus be applied across the coil 44 by cyclically switching the switches $S_1$-$S_4$ between these two alternate states. If this is done at RF frequencies, then an RF carrier signal results.

Referring back to FIG. 2, the transistor switches 70, 72, 74 and 76 are controlled by signals applied to their gate electrodes. The gate signals for all four transistors are derived from individual secondary transformer windings. This transformer has a toroidal ferrite core with a primary winding 82 and four secondary windings 84, 86, 88 and 90 wound around it. The turns ratio of the transformer is 1:1, whereby the same signal appearing at the primary is applied to each of the circuits connected to the four secondary windings.

Each of the four secondary windings is connected between the gate and source electrodes of an associated one of the MOSFETs 70-76. The secondary 84 is directly connected between the gate MOSFET 70 and junction $J_1$, while secondary 88 is similarly directly connected between the gate of MOSFET 74 and junction J2. The secondary windings 86 and 90 are in like manner connected between the gate and source electrodes of MOSFETS 72 and 76, however in these cases impedance networks 92 and 94 are connected in series with the coils 86 and 90, respectively. Each impedance network 92, 94 includes a parallel combination of a resistor 96, 98 and capacitor 100, 102. The purpose of these impedance networks will be described hereinafter during the description of the amplifier control circuitry 104.

The primary winding 82 of the toroidal transformer is connected to the output of the RF source 20, which provides a sinusoidal RF driving voltage to the power amplifier. Each MOSFET turns "on" when the RF signal applied to its gate is on its positive half cycle and "off" when the applied signal is on its negative half cycle. The MOSFETs therefore cyclically turn on and off at a frequency and phase of the applied RF gate signal. The windings 84 and 90 are connected across MOSFETs 70 and 76 in similar directions whereby the signals appearing at the gates of these transistors are in phase with one another. MOSFETs 70 and 76 therefore turn on and off in unison. Windings 86 and 88, on the other hand, are connected across MOSFETs 72 and 74 in a direction opposite to the direction of connection of the windings 84 and 90. The signals applied to the gates of MOSFETs 70 and 76 are therefore 180° out of phase with respect to the signals applied to the gates of transistors 74 and 72. Consequently, when transistors 70 and 76 are "on", transistors 72 and 74 are "off", and vice versa.

Due to the nonlinear transfer characteristics of the MOSFETs 70, 72, 74 and 76, the MOSFETs will abruptly turn on and off in response to the applied sinusoidal signal, rather than linearly following it. The signal applied across the junctions $J_1$ and $J_2$ will therefore have essentially a squarewave form, though at the frequency of the applied RF input signal. The load 14 to which the output of the combiner circuit 24 of FIG. 1 is connected will generally be frequency selective, and will select only a fundamental component of this squarewave.

As shown in FIG. 2, the power amplifier $PA_1$ includes a switching circuit 104 for turning the power amplifier on and off in response to the control signal appearing on the digitizer output line $D_1$. The switching circuit 104 includes a NPN bipolar junction transistor 106 having its emitter grounded and its collector connected to the gates of MOSFETs 72 and 76 through corresponding diodes 108 and 110. The base of the transistor 106 is connected to the $D_1$ output of the digitizer 24 through a base resistor 112. When the control signal applied to the base resistor 112 has a high logic level (i.e., logic "1"), base current is applied to the transistor 106, forcing it into a saturation. The gates of the transistors 72 and 76 are then effectively grounded through the corresponding diodes 108 and 110. This has the effect of clamping the gate signals of these transistors to a ground potential, thereby forcing both of them to remain in an "off" condition. The primary winding 44 is thus effectively disconnected from ground, thereby turning off the power amplifier.

The resistors 96 and 98 in the gate circuits of MOSFETs 72 and 76 limit the DC current through transistor 106 when it is saturated. Were these not included the current through the transistor 106 would be quite high because the windings 86 and 90 act as voltage sources. The capacitors 100 and 102 bypass the resistors, reducing their effect at RF frequencies. A third capacitor 114 is connected between both capacitors 100 and 102. This capacitor improves the turn-on/turn-off characteristics of the amplifier.

When the control signal applied to the base of transistor 106 is at a low logic level (i.e. logic "0"), the transistor 106 is cut off and the operation of the amplifier 26 is substantially as described previously. However, this logic 0 signal is a negative signal and it serves to turn on PNP transistors 95 and 97 through base drive resistors 91 and 93, respectively. When these transistors are turned on forcing them into saturation, they, in turn, rapidly drive the MOSFET switching transistors 72 and 76 into saturation.

One of the problems associated with operating power amplifiers as described hereinabove is that the turn on control signal applied to transistors 95 and 97 must be sufficient to drive these transistors into saturation so that the MOSFET switching transistors operate as switches and not resistors which could cause excessive MOSFET dissipation, high stress and potential failure. This turn on or binary "0" signal is a negative DC voltage which is hereinafter referred to as a B— voltage. It is to be noted that the same RF current flows in all of the power amplifiers and as the number of power amplifiers that are turned on increases, the magnitude of the RF current increases. This causes the impedance of the switching transistors to also increase. Consequently, increases in the magnitude of the modulating signal requires increases in the number of power amplifiers that are turned on which, in turn, makes it more difficult to rapidly actuate the switching transistors. It is for this reason that it has been known in the art to vary the B— voltage so as to be dependent on the transmitter instantaneous power output. Thus, as more power amplifiers are turned on, the B— voltage is increased in a negative direction so as to track the modulating signal. This B— voltage, however, is significant as to the proper switching of the RF amplifiers such that too low of a voltage may cause excessive RF amplifier dissipation, high stress and potential failure. It is for this reason that the B— voltage is monitored by a fault comparator to insure that it does not cause excessive RF amplifier dissipation and potential failure. With the B— voltage required to modulate 75% of the total DC range a fixed DC threshold for the fault comparator must be set at a very low level in order to allow the negative peak modulation of a low power output to not trip the fault comparator. This fixed threshold is well below the required average operating voltage for the B— supply when the transmitter is operating at higher power outputs. This will all be explained in greater detail below.

Briefly, the present invention is, in part, directed to providing a reference voltage for the fault comparator with the reference voltage being modulated with a processed sample of the modulating signal that drives the B— regulator. This will allow the comparator reference to track the driving signal to the B— regulator. Consequently, the fault sensing trip threshold can be set to a fixed percentage of the sensed signal regardless of the modulated level of the signal.

Reference is again made to FIG. 1 from which it is seen that the modulating audio input signal is supplied to an analog processing circuit 33 which adds a DC level to the audio signal and provides this audio plus DC level to a DC regulator 35 and to an analog-to-digital converter 37 which supplies the digitizer 16. The DC regulator 35 and the digitizer 16 are disclosed in greater detail in FIG. 3 to which reference is now made.

As shown in FIG. 3, the audio input is supplied to an analog processing circuit 33 which adds a DC level to the signal and provides this audio plus DC signal to an analog-to-digital converter. The converter 37 converts the signals into a digital representation thereof and which is then decoded by means of a decoder 39. As discussed previously, the number of control signals D1-DN that are supplied by the decoder will vary with the magnitude of the audio signal and D.C. level received from the audio input 12. The decoder supplies either binary 1 (turn off signals) or binary 0 (turn on signals) to the respective power amplifiers $PA_1$-$PA_N$. The binary 1 signals will hereinafter be referred to as positive DC voltages of a value B+ whereas the binary 0 signals will hereinafter be referred to as negative DC voltages of a value B−. These B+ and B− signals are supplied by amplitude drivers DR-1, DR-2 . . . through DR-N. Each of these amplitude drivers may take the form such as that of driver DR-1 illustrated in FIG. 4.

Figure 4:
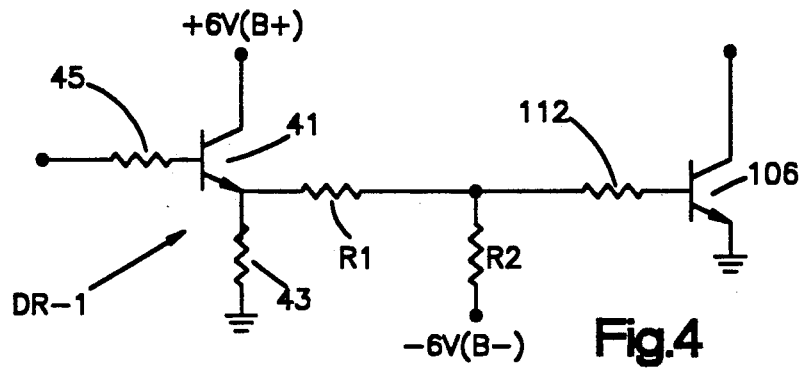
FIG. 4 is a schematic circuit illustration of an amplifier driver circuit employed in the circuitry of FIG. 3.

Reference is now made to FIG. 4 which shows an amplitude driver DR-1 for use in supplying either a B+ or a B− signal for turning off or turning on a power amplifier such as power amplifier $PA_1$ illustrated in FIG. 2. A B+ signal when supplied through resistor 112 to the base of transistor 106 will turn the transistor on and if the B+ voltage is of sufficient magnitude, it will drive the transistor into saturation as described hereinbefore. Similarly, if a B− voltage is applied through resistor 112 to the base of transistor 106, it will turn the transistor off and, in addition, will drive transistors 95 and 97 into saturation causing the MOSFETs 72 and 76 to switch on. The B+ voltage may, for example, be of a magnitude on the order of +6 volts, whereas the B− signal is a modulated B− voltage having a range on the order of −2 volts to −6 volts. This B− signal is connected through a resistor R2 to the resistor 112. The B+ voltage is supplied through the collector-to-emitter circuit of an NPN transistor 41 and then through a resistor R1 and resistor 112 to the base of transistor 106 as well as through resistors 91 and 93 to the base of transistors 95 and 97. The emitter of transistor 41 may be connected to ground by way of resistor 43 whereas the input to the base of transistor 41 may include a base drive resistor 45. A binary 1 signal provided by the digitizer will turn the transistor 41 on supplying a B+ or 6 volts as a drive signal to turn on transistor 106 and thereby turn off the power amplifier $PA_1$. On the other hand, when a binary 0 signal is supplied to turn off transistor 41, a B− drive signal is supplied to turn off the transistor 106 and turn on transistors 95 and 97 so as to thereby turn on the switching transistors 72 and 76. As will be discussed in greater detail hereinafter, the B− voltage varies over a range on the order of from −2 volts to −6 volts. Resistor R1 has a value on the order of one-half that of resistor R2 and this will affect the voltage drop at the juncture of resistors R1 and R2 and thereby affect the magnitude of the B− signal that is actually supplied to transistors 95 and 97. The examples described in greater detail hereinafter illustrate the manner of operation that takes place when the magnitude of the B− voltage drops from approximately −6 volts to approximately −3 volts for the circuitry of the prior art as for the circuitry of the present invention.

The audio plus DC output of the analog processing circuitry 33 illustrated in FIG. 3 is supplied to the DC regulator 35 by way of a signal inverter 150. The DC regulator 35 includes a B+ regulator 152 as well as a modulated B− regulator 154. Regulator 152 in a conventional fashion receives an unregulated positive input voltage from a source 156 and maintains and regulates the voltage to provide a regulated B+ output, such as a regulated positive 6 volts. This B+ voltage is then monitored by a fault sensing circuit 158 which may include a comparator for comparing the B+ voltage with a threshold level and, providing the B+ level has not decreased below the threshold level, no fault is sensed. If the B+ voltage falls below the reference level, the fault sensing comparator circuit 158 provides a fault indication as a positive output which is applied through an OR gate 160 to open a switch 162 to disconnect a normal connection between the power amplifiers $PA_1$-$PA_N$ to the main DC voltage $V_{DC}$. This will shut the transmitter down.

The B− regulator 154 is described in greater detail hereinafter with reference to FIG. 5 and it serves to receive an unregulated negative voltage from a source 164 and vary the magnitude of its output voltage B− over a range, such as from −2 volts to −6 volts, in dependence upon the magnitude of the modulating signal obtained from the analog processing circuit 33 by way of the inverter 150. Thus, as the magnitude of the audio signal or D.C. level increases, the B− voltage will increase in a negative direction. Conversely, as the audio signal decreases in magnitude, the B− voltage will decrease in a positive direction. The B− voltage is compared with a reference by means of a B− voltage comparator 166 and if the B− signal falls below the level of the reference, the fault comparator supplies a positive signal through the OR gate 160 to open switch 162 to turn off the transmitter. As discussed earlier herein, this B− voltage is significant with respect to the proper switching of the RF amplifier such that too low of a voltage can cause excessive RF amplifier dissipation, high stress and potential failure. The B− voltage is varied dependent upon the transmitter instantaneous power output which, in turn, varies with the level of the modulating signal. With the B− voltage required to modulate approximately 75% of the total DC range from −2 volts to −6 volts, the prior art employment of a fixed DC threshold for the fault comparator 166 required that the threshold be set at a very low level to allow the negative peak modulation or low power output to not trip the fault circuit and cause turn off of the transmitter. This fixed threshold was well below the required average operating voltage for the B− supply when the transmitter is operating at higher power outputs.

In accordance with the present invention, the reference voltage for the B− fault comparator 166 is modulated with a processed sample of the modulating signal that drives the B− regulator-amplifier 154. This variable reference voltage is obtained from circuitry including a comparator reference modulator 170 and a reference clamp circuit 172 to be described in greater detail hereinafter with respect to FIG. 5. This allows the variable comparator reference to track the driving signal to the B− regulator 154. The fault sensing trip threshold is set to a fixed percentage of the sensed signal regardless of the modulated level of that signal.

Figure 5:
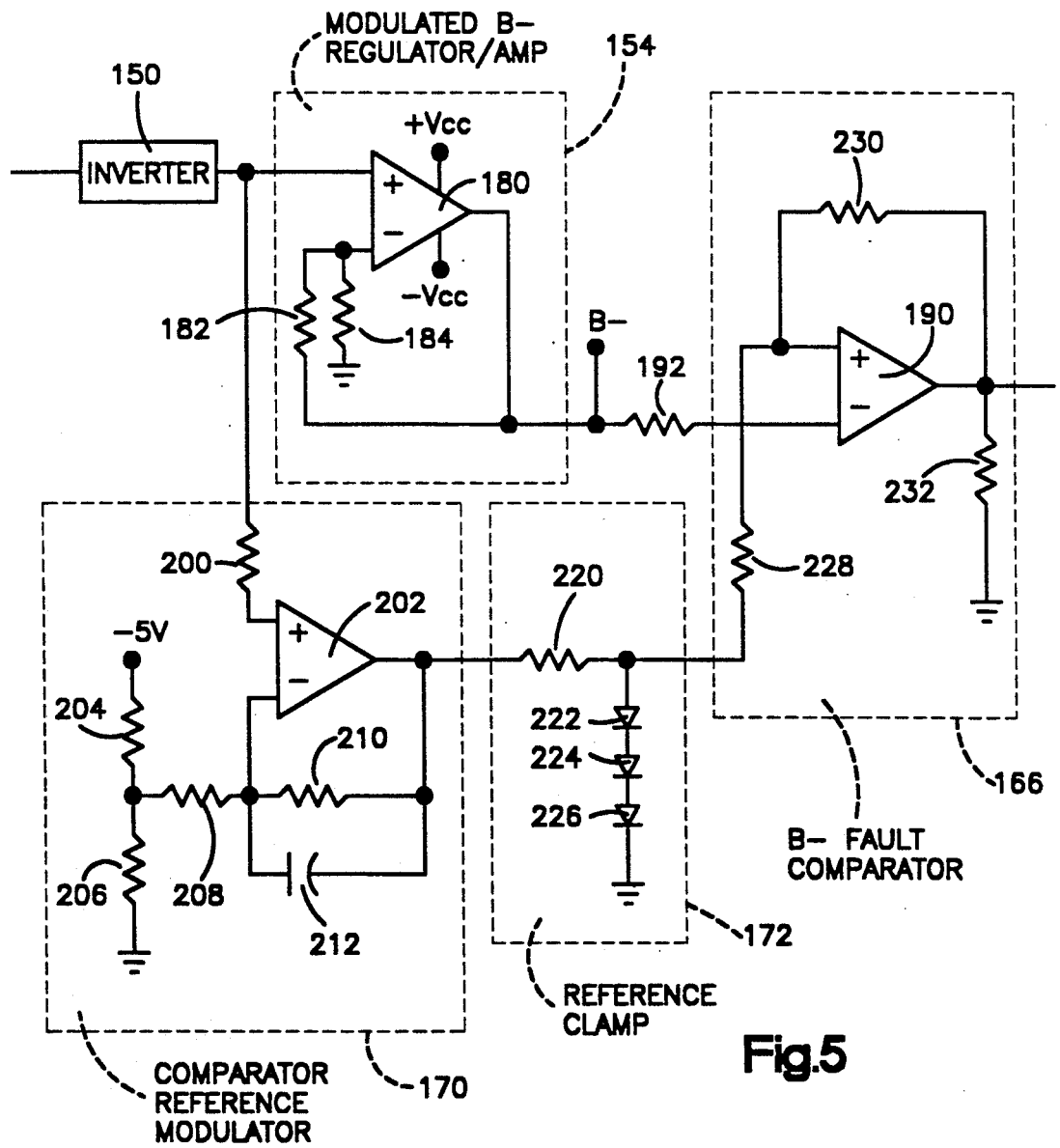
FIG. 5 is a schematic circuit illustration of various of the circuits shown in block diagrams in the DC regulator of FIG. 3.

Reference is now made to FIG. 5 from which it is seen that the audio plus DC signal is inverted by the signal inverter 150 and supplied to the modulated B− regulator-amplifier 154 which includes an operational amplifier 180 having unregulated positive and negative voltages $+V_{cc}$ and $-V_{cc}$ supplied thereto. The output of the amplifier 180 is applied by a feedback resistor 182 to the negative input of the amplifier. A second resistor 184 connects the negative input of the amplifier to ground. The output of the modulated regulator-amplifier 152 is referred to as a modulated B− signal as it varies in magnitude with that of the audio plus DC drive signal. This modulated B− signal is supplied to the amplitude drivers DR-1 through DR-N as well as to the negative input of a comparator 190 by way of a resistor 192. The comparator 190 is located in the B— fault comparator 166.

The output of the inverter 150 is also applied through a resistor 200 to the positive input of a noninverting operational amplifier 202 having a gain of 2 and located in the comparator reference modulator 170. A positive offset is provided by resistors 204, 206 and 208. The output of the amplifier 202 is connected to its negative input by a feedback path including a resistor 210 connected in parallel with a capacitor 212.

The output of the comparator reference modulator 170 is supplied to a reference clamp circuit 172 comprised of a resistor 220 and diodes 222, 224, and 226. This reference clamp circuit limits the reference voltage supplied to the fault comparator 166 to a preset minimum voltage which is typical of what the reference voltage would be if it were a fixed voltage instead of a variable voltage. For purposes of the discussion herein, this limits the reference voltage to −2 volts. That is, the reference voltage can vary from −2 volts to −6 volts but will not become more positive than −2 volts. The reference voltage is supplied by way of a resistor 228 to the positive input of comparator 190 in the fault comparator 166. The comparator 190 has feedback resistor 230 connected from its output to its positive input. An output resistor 232 is connected between the amplifier output and ground.

Figure 6:
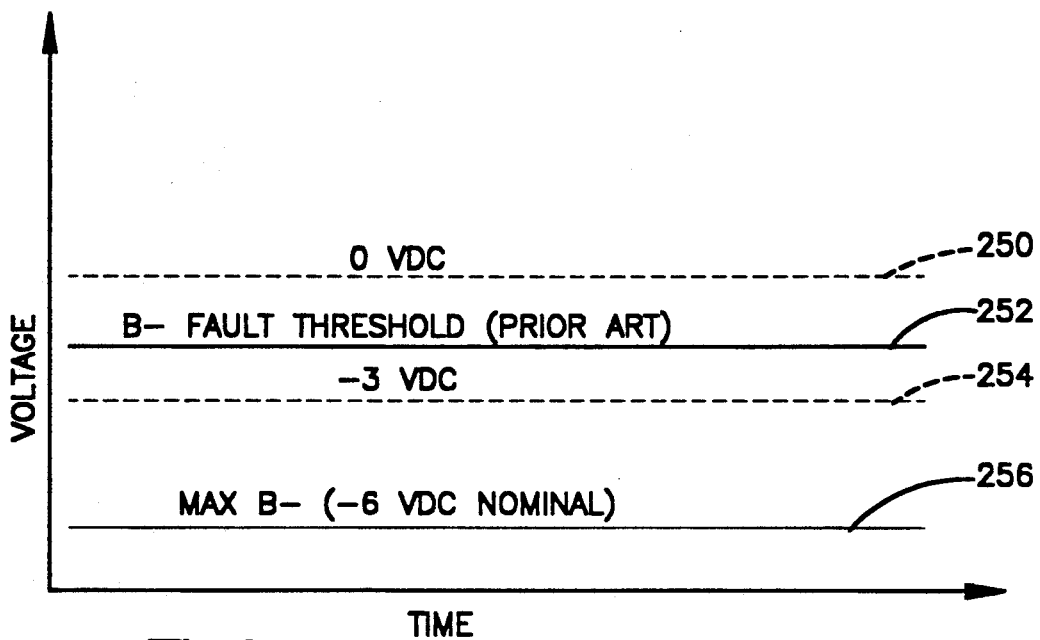
FIG. 6 is a graphical illustration of voltage with respect to time showing a prior art operation.
Figure 7:
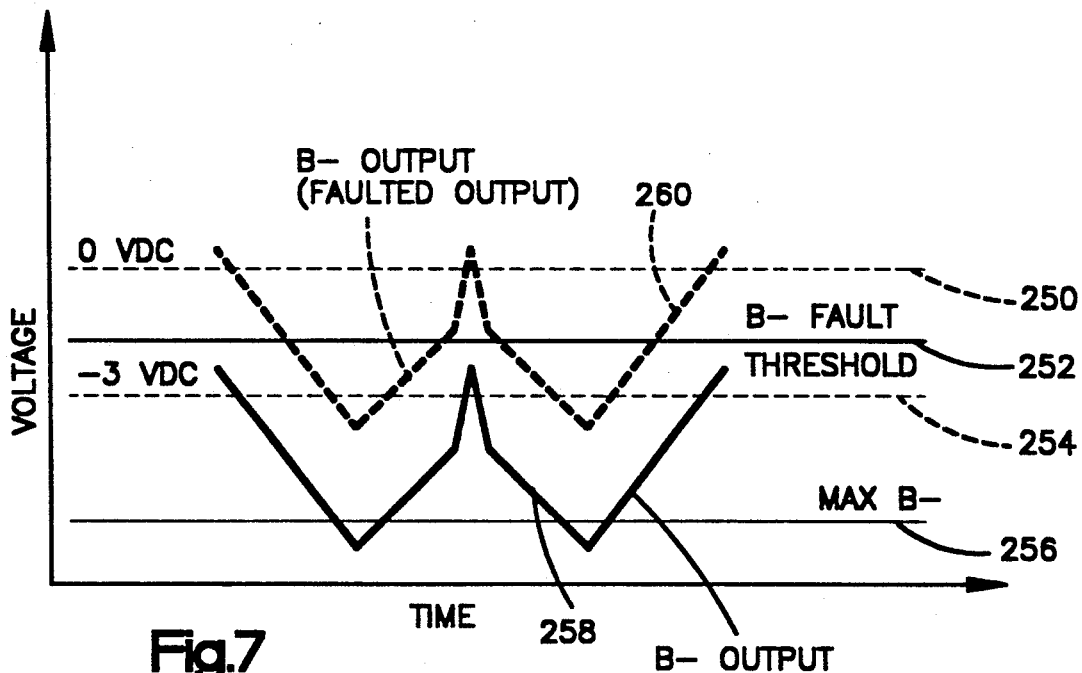
FIG. 7 is a graphical illustration of voltage with respect to time showing a prior art operation.

Reference is now made to FIGS. 6 and 7 which are graphical illustrations representative of the operation of the prior art circuitry which did not include the comparator reference modulator 170 and the reference clamp 172 which apply a variable reference to the B— fault comparator 166. Instead, the prior art being referred to supplied a fixed reference voltage as a fault threshold on the order of −2 volts.

Attention is directed to FIG. 6 which illustrates curves 250, 252, 254 and 256. Curve 250 is merely a dotted line showing the level of zero volts DC. Curve 256 represents the normal level of the modulated B— voltage illustrated as being −6 volts DC at full power with zero percent modulation. Curve 252 illustrates the prior art fixed fault threshold level which is set for this example at −2 volts DC. Curve 254 illustrates that there is a faulted B— output because the B— level has dropped from −6 volts to −3 volts with the transmitter still at full power and the audio plus D.C. level has not changed. However, with this level of the B— voltage, there is no crossing of the fixed threshold curve 252 and, consequently, the transmitter is not turned off. With full power and zero modulation, it is typical for substantially half of the power amplifiers to be operating and at this level a drop in the B— voltage from −6 volts to −3 volts may cause excessive RF amplifier dissipation, high stress and potential failure of the switching transistors employed in the power amplifiers.

The same circuit described above will operate to turn off the transmitter if, instead of zero percent modulation the transmitter is operated at full power with 100% modulation. This operation is illustrated in FIG. 7 wherein curve 250 presents the zero volt DC level, and curve 252 shows the prior art fixed B— fault threshold level at approximately −2 volt. For reference purposes, the curves 254 and 256 correspond with the curves 254 and 256, respectively, in FIG. 6. However, in FIG. 7, the operation is illustrated with the modulated B— voltage varying at full power with 100% modulation. This is illustrated by curve 258 as being representative of the normal B— output with 100% modulation. Curve 260 illustrates a faulted B— output which has dropped by 3 volts from that of the curve 258. In this instance, however, it is seen that the B— faulted output represented by curve 260 crosses the prior art fixed fault threshold level illustrated by curve 252 and this shows that such a prior art system will turn off the transmitter by opening switch 162 to remove power from the power amplifiers $PA_1$-$PA_N$. The point being made is that the prior art circuitry operated to turn off the transmitter when the B— voltage dropped by 3 volts when the transmitter is modulated but will not turn off the transmitter when it is not modulated as is illustrated by the curves in FIG. 6. This may cause failure of the switching transistors employed in the power amplifiers.

Figure 8:
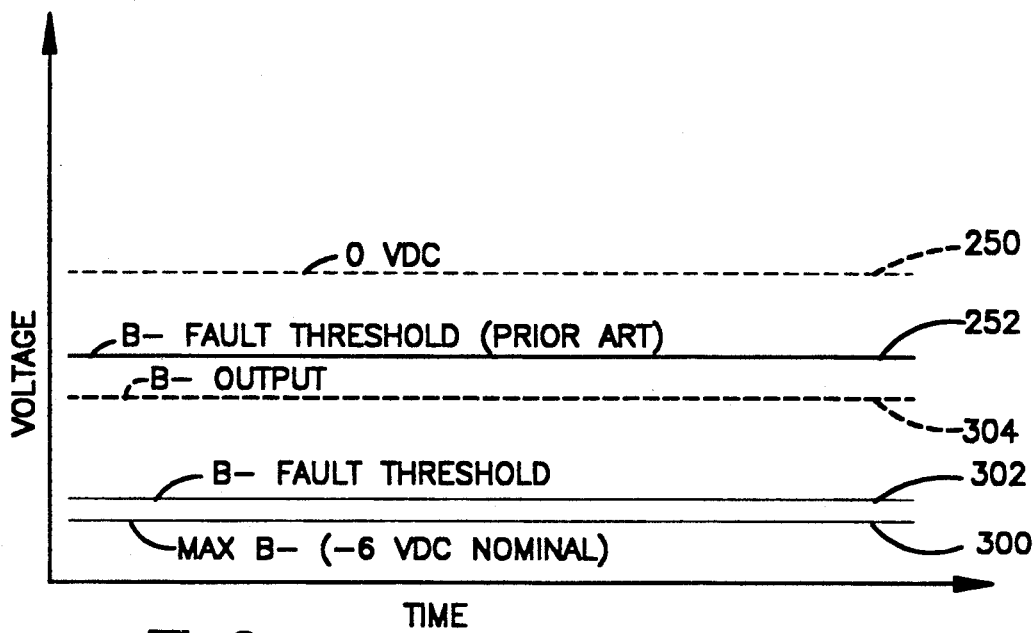
FIG. 8 is a graphical illustration of voltage with respect to time illustrating the manner of operation of circuitry constructed in accordance with the present invention.
Figure 9:
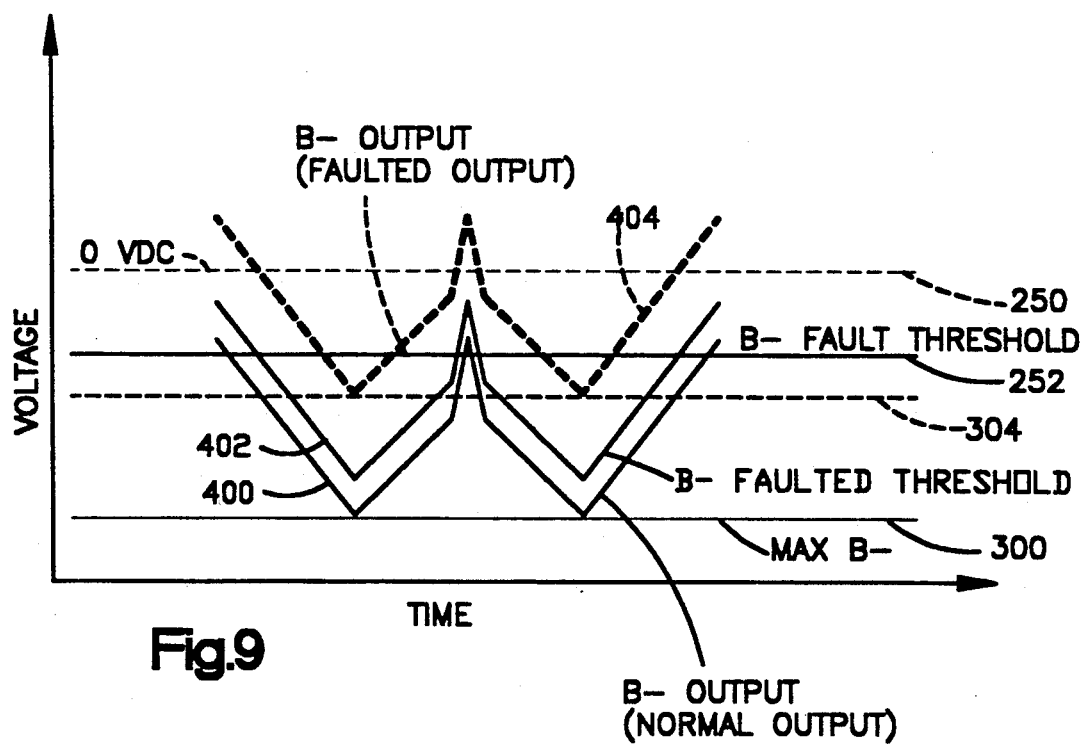
FIG. 9 is a graphical illustration of voltage with respect to time also showing operations in accordance with the present invention.

Reference is now made to FIGS. 8 and 9 which illustrate the operation when the circuitry has been modified in accordance with the present invention by including the comparator reference modulator 170 and the reference clamp circuit 172 which supply a variable reference instead of a fixed reference to the B— fault comparator 166.

FIG. 8 is similar to FIG. 6 and includes curves 250 and 252 in the same sense as those curves are employed in FIGS. 6 and 7. Additionally, FIG. 8 includes curves 300, 302 and 304. As in the case of FIG. 6, the waveforms in FIG. 8 illustrate the operation that takes place at full power but with zero percent modulation. Curve 300 is shown as being steady state at −6 volts and represents the modulated B— normal output for full power with zero percent modulation. As will be recalled from the discussion hereinabove, the reference voltage supplied to the reference input of the fault comparator 166 varies as a percentage of the normal B— output which, in this case, is a steady state level at −6 volts. With that percentage being set at 90%, it is seen that the B— fault threshold in accordance with the present invention is at a level of −5.4 volts, as is illustrated by curve 302. If the B— power supply now is faulted so that it drops in magnitude by 3 volts to a level of −3 volts DC as is indicated by the curve 304, then it is seen that the B— faulted output has crossed the B— fault threshold level as represented by curve 302 and this will result in shut down of the transmitter by opening switch 162 in FIG. 3. The prior art fixed fault threshold level of −2 volts is illustrated by the curve of 252 which, as is seen, is too low to result in a shut down of the transmitter with a faulted B— output of, for example, −3 volts DC and which represents a 50% decrease in the voltage level.

Thus, it is seen that the operation as illustrated in FIG. 8 demonstrates that a 3 volt drop in the modulated B— output voltage will shut off the transmitter because the faulted DC level does cross the modulated threshold level represented by curve 302.

Reference is now made to FIG. 9 which shows the operation that takes place with the inclusion of the modulator 170 and the reference clamp circuit 172 wherein the modulated B— signal is illustrated at full power conditions and 100% modulation. The normal modulated B— output voltage is represented by curve 400. Curve 402 illustrates the varying level of the modulated B— fault threshold reference that is supplied to the fault comparator 166 and exhibiting a level on the order of 90% of the magnitude of the normal modulated B— voltage output. Curve 404 illustrates the faulted B— output voltage which has dropped in value by 3 volts from a maximum level on the order of −6 volts to that at −3 volts. The faulted B− output represented by curve 404 has crossed the modulated threshold level represented by curve 402 and, consequently, the fault comparator supplies an activating signal through OR gate 160 to open switch 162 to turn off the transmitter. The curves in FIG. 9 demonstrate that a 3 volt drop in the B− output will shut off the transmitter because the faulted modulated B− output represented by curve 404 does cross the modulated threshold line, as represented by curve 402.

Although the invention has been described in conjunction with a preferred embodiment, it is to be appreciated that various modifications may be made without departing from the spirit and scope of the invention a defined by the appended claims.

Having described the invention, the following is claimed:

1. A modulated voltage supply and fault monitoring thereof, comprising:
   means for providing a modulating signal having a variable magnitude;
   a modulated voltage supply for receiving an input voltage and said modulating signal for modulating said input voltage to provide a modulated output voltage which has been amplitude modulated in accordance with the amplitude variations of said modulating signal;
   reference means for receiving said modulating signal and providing a variable reference signal having a magnitude that varies with that of said modulating signal; and
   fault comparing means for comparing the magnitude of said modulated signal and that of said variable reference signal and providing a fault signal in dependence upon said comparison.

2. A modulated voltage supply as set forth in claim 1 wherein said fault comparing means includes means for providing a fault signal when said modulated signal has decreased in magnitude below that of said reference signal.

3. A modulated voltage supply as set forth in claim 1, wherein said reference means includes means for receiving said modulating signal and providing therefrom a said variable reference signal having a magnitude that varies as a given percentage of that of said modulating signal.

4. A modulated voltage supply as set forth in claim 1 wherein said modulating signal includes an audio signal.

5. A modulated voltage supply as set forth in claim 1 wherein said reference means includes means for providing a said variable reference signal having a magnitude which is a fixed percentage of that of said modulating signal, and wherein said fault comparing means provides a said fault signal when said modulated signal has a magnitude which falls below the level of said reference signal.

6. A modulated voltage supply as et forth in claim 5 wherein said modulating signal includes a audio signal.

7. A modulated voltage supply and fault monitoring circuit as set forth in claim 1 in combination with an RF power amplifier system comprising:
   a DC voltage source;
   an RF source for providing an RF drive signal;
   a plurality of actuatable RF power amplifiers, each connected to said DC source, and each, when actuated, for receiving and amplifying said RF drive signal, and each having an output circuit for providing an amplified RF output signal;
   means for actuating a selected one or more of said RF amplifiers in dependence upon the magnitude of said modulating signal;
   means for additively combining said RF output signals to provide a combined RF output signal; and
   said means for actuating including means for applying turn-on and turn-off signals to each of said amplifiers with one of said turn-on and turn-off signals corresponding with said modulated output voltage.

8. A modulated voltage supply as set forth in claim 7 wherein said fault comparing means includes means for providing said fault signal when said modulated signal has decreased in magnitude below that of said reference signal.

9. A modulated voltage supply as set forth in claim 7, wherein said reference means includes means for receiving said modulating signal and providing therefrom a said variable reference signal having a magnitude that varies with a given percentage of that of said modulating signal.

10. A modulated voltage supply as set forth in claim 7 wherein said modulating signal includes an audio signal.

11. A modulated voltage supply as set forth in claim 7 wherein said reference means includes means for providing a said variable reference signal having a magnitude which is a fixed percentage of that of said modulating signal, and wherein said fault comparing means provides a said fault signal when said modulated signal has a magnitude which falls below the level of said reference signal.

12. A modulated voltage supply as set forth in claim 11 wherein said modulating signal includes an audio signal.

13. An RF power amplifier system having a modulated voltage supply and fault monitoring thereof comprising:
   means for providing an audio modulating signal having a variable magnitude with respect to time;
   a modulated voltage supply for receiving an input voltage and said modulating signal for modulating said input voltage to provide a modulated output voltage which has been amplitude modulated in accordance with the amplitude variations of said modulating signal;
   reference means for receiving said modulating signal and providing a variable reference signal having a magnitude that varies with said modulating signal, and wherein the magnitude of said reference signal is a fixed percentage of that of said modulating signal; and
   fault comparing means for comparing the magnitude of said modulated signal with that of said variable reference signal and providing a fault signal when said comparison indicates that said modulated output voltage has decreased in value below that of said reference signal; and
   means responsive to a said fault signal for deactivating said RF power amplifier system.

* * * * *